US005929799A

United States Patent [19]
Rothenberg

[11] Patent Number: 5,929,799
[45] Date of Patent: Jul. 27, 1999

[54] OUT-OF-RANGE DETECTOR FOR PIPELINE ADC

[75] Inventor: Bret C. Rothenberg, Los Altos, Calif.

[73] Assignee: Exar Corporation, Fremont, Calif.

[21] Appl. No.: 08/892,710

[22] Filed: Jul. 15, 1997

[51] Int. Cl.[6] .......... H03M 1/14
[52] U.S. Cl. .......... 341/156; 341/161; 341/118
[58] Field of Search .......... 341/118, 139, 341/161, 162, 163

[56] References Cited

U.S. PATENT DOCUMENTS

| | | | |
|---|---|---|---|
| 4,386,339 | 5/1983 | Henry et al. | 341/159 |
| 4,908,621 | 3/1990 | Polonio et al. | 341/120 |
| 5,043,732 | 8/1991 | Robertson et al. | 341/156 |
| 5,274,377 | 12/1993 | Matsuura et al. | 341/61 |
| 5,420,587 | 5/1995 | Michel | 341/156 |
| 5,668,549 | 9/1997 | Opris et al. | 341/118 |

*Primary Examiner*—Marc S. Hoff
*Attorney, Agent, or Firm*—Townsend and Townsend and Crew LLP

[57] ABSTRACT

Out-of-range comparators for an analog-to-digital converter at other than the first stage of a pipeline ADC. By using a subsequent stage, the accuracy required for the ADC is reduced. The offset voltage of these comparators are reduced when input referred through the gain of the cascade of pipeline amplifiers in front of it, thus reducing the necessary accuracy required for out-of-range indication. This results in the accuracy requirement of the out-of-range comparators being greatly reduced. ADC fault detection is possible when these out-of-range comparators are located at the output of the final stage.

6 Claims, 2 Drawing Sheets

OUT-OF-RANGE DETECTOR FOR PIPELINE ADC

BACKGROUND OF THE INVENTION

The present invention relates to out-of-range detectors for analog-to-digital converters (ADC), and more particularly to a pipelined ADC.

One traditional type of ADC receives an analog input voltage to be converted into digital form at the input of a pipeline of stages. The first stage does the first, rough determination of where the analog level is, producing the most significant bit of the result. Subsequent stages further refine the determination of the value of the signal, producing additional bits in less significant positions of the answer. This type of ADC has advantages where multiple conversions are done, and can be pipelined, with multiple different values propagating through the pipeline to provide a high throughput.

A disadvantage of a pipelined ADC is where a single value needs to be determined quickly, since it needs to propagate through the pipeline. Flash architectures and bipolar technologies have been used to produce essentially a single stage ADC which can produce an answer in a single clock cycle. A disadvantage of such an architecture, however, is that for larger bit resolution values, the size and power dissipation of the circuit increases significantly.

Typically, an out-of-range (OTR) indicator is used with two comparators added to the input of the ADC in either pipelined or non-pipelined configurations. These two comparators will compare the input analog signal to the full scale positive voltage and the full scale negative voltage. If these values are exceeded, an out-of-range indication will be provided. However, to provide an accurate out-of-range indication, such a comparator must have an offset value of better than the accuracy of the least significant bit resolution of the ADC. Accordingly, highly accurate comparators are required, increasing the complexity, area, and power required for such comparators.

SUMMARY OF THE INVENTION

The present invention provides out-of-range comparators for an analog-to-digital converter at other than the first stage of a pipeline ADC. By using a subsequent stage, the accuracy required for the OTR comparators is reduced. The offset voltage of these comparators, input referred, is reduced by the gain of the cascade of pipeline amplifiers in front of it, thus reducing the necessary accuracy required for an out-of-range indication.

In a preferred embodiment, the out-of-range indicators are put at the last stage of the entire pipeline. In one embodiment, the last stage of such a pipeline is constructed as a flash ADC. An additional advantage of placing such comparators at the end of the pipeline is that they can be used for fault detection. If the offsets of the previous stages' comparators exceed the correction range, the offset residue will saturate each subsequent stage, which will be detected by the out-of-range comparators at the last stage.

Another advantage of placing the out-of-range comparators at the end of the pipeline is that the out-of-range signal can be computed using just a single digital gate, eliminating the need for correction logic being extended to include additional carry and borrow signals.

For further understanding of the nature and advantages of the invention, reference should be made to the following description taken in conjunction with the accompanying drawings.

DESCRIPTION OF THE PREFERRED EMBODIMENT

Figure 1:
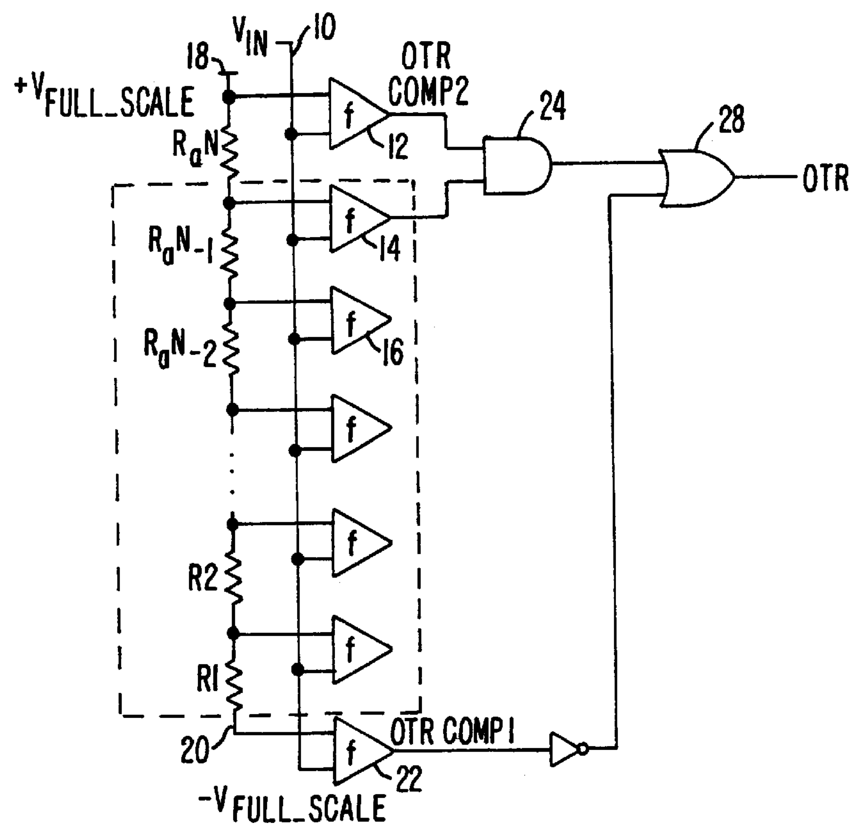
FIG. 1 is a block diagram of a prior art standard flash ADC.

FIG. 1 is a diagram of a standard prior art flash ADC. The input analog voltage is applied on a line 10 to a series of comparators 12, 14, 16, etc. The other input of the comparators is derived from a resistor ladder with a series of resistors connected between a positive full scale voltage at node 18 and a negative full scale voltage at node 20. Resistors R1, R2 through $R2^N$ are shown, where N is the resolution of the ADC.

The comparators on the end are the out-of-range comparators. A positive out-of-range comparator 12 is used, along with a negative out-of-range comparator 22. These comparators are added to the top and bottom of the resistor ladder, respectfully. In order for these two comparators to accurately indicate an out-of-range (OTR) condition, they must have an input referred offset of less than $\frac{1}{2}^N$ the full scale voltage, where N is the resolution of the analog to digital converter.

As shown in FIG. 1, the output of the OTR comparators are provided to AND gate 24 and an OR gate 28, which provides the OTR signal. This logic is a simplification of the actual logic used to decode a flash ADC, with the actual logic being known to one of skill in the art.

Figure 2:
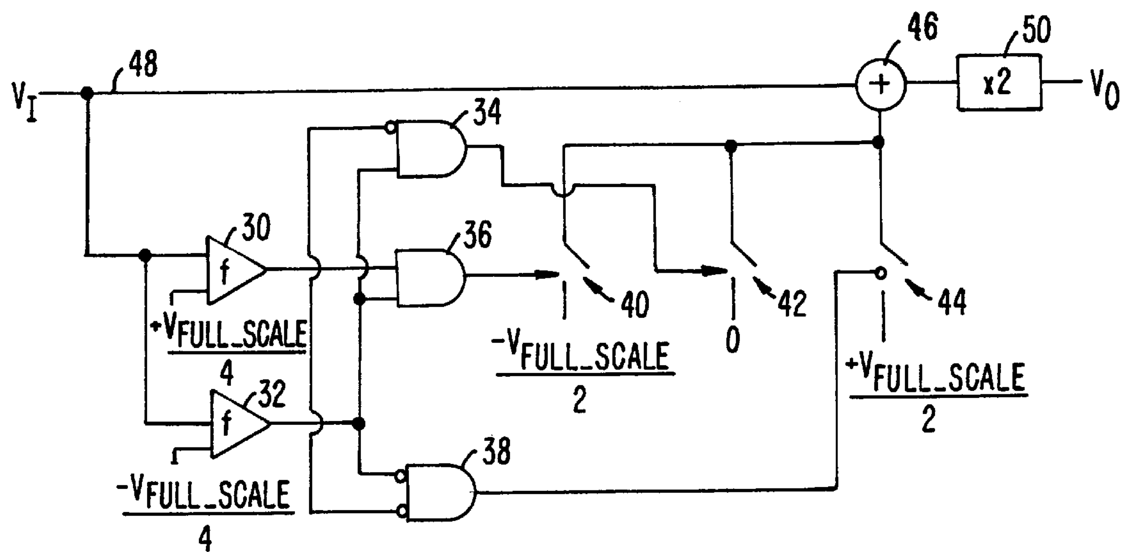
FIG. 2 is a block diagram of one stage of a standard prior art 1.5 bit/stage pipeline ADC.

FIG. 2 illustrates one stage of a multiple stage, pipeline ADC. For a more detailed description of a pipeline ADC, reference is made to an article by Stephen H. Lewis, et al entitled "A 10-b 20-Msample/s Analog-to-Digital Converter", IEEE Journal of Solid-State Circuits, Vol. 27, No. 3, March 1992, page 351. As shown in FIG. 2, a pair of comparators 30 and 32 are provided with references at ±¼ the full scale voltage. The output of these comparators are provided to three AND gates 34, 36 and 38. The AND gates in turn control three switches, 40, 42 and 44, respectively, to couple an appropriate voltage level to a summer circuit 46 for combining with the input signal on line 48. The output of summer circuit 46 is provided to a doubling amplifier 50 to provide the offset residue to the next stage.

Figure 3:
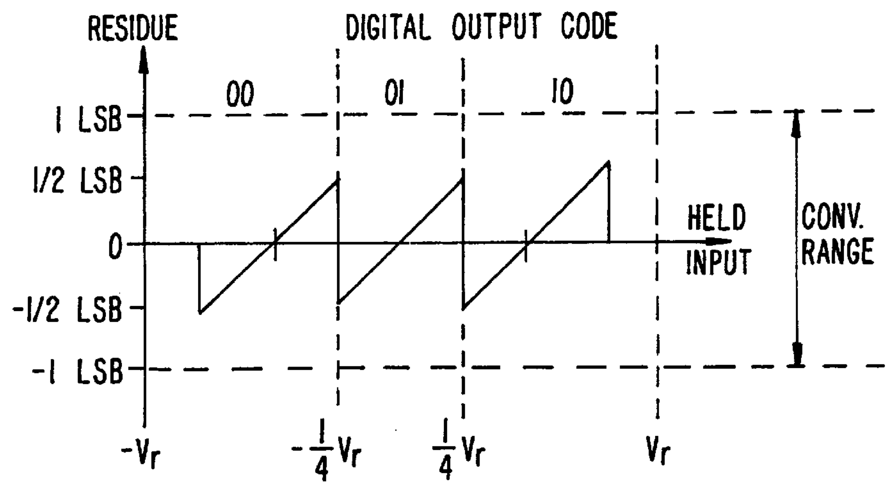
FIG. 3 is a graph illustrating the residue plot for a 1.5 bit/stage of a pipeline ADC.

The circuit of FIG. 2 implements the transfer function (residue plot) shown in FIG. 3. Depending upon where the voltage falls within the ranges shown along the X axis in FIG. 3, a 1.5 bit output value. The final output is determined by summing all the digital outputs. By determining only 1.5 bits instead of 2 bits, only two comparators are needed per stage.

Figure 4:
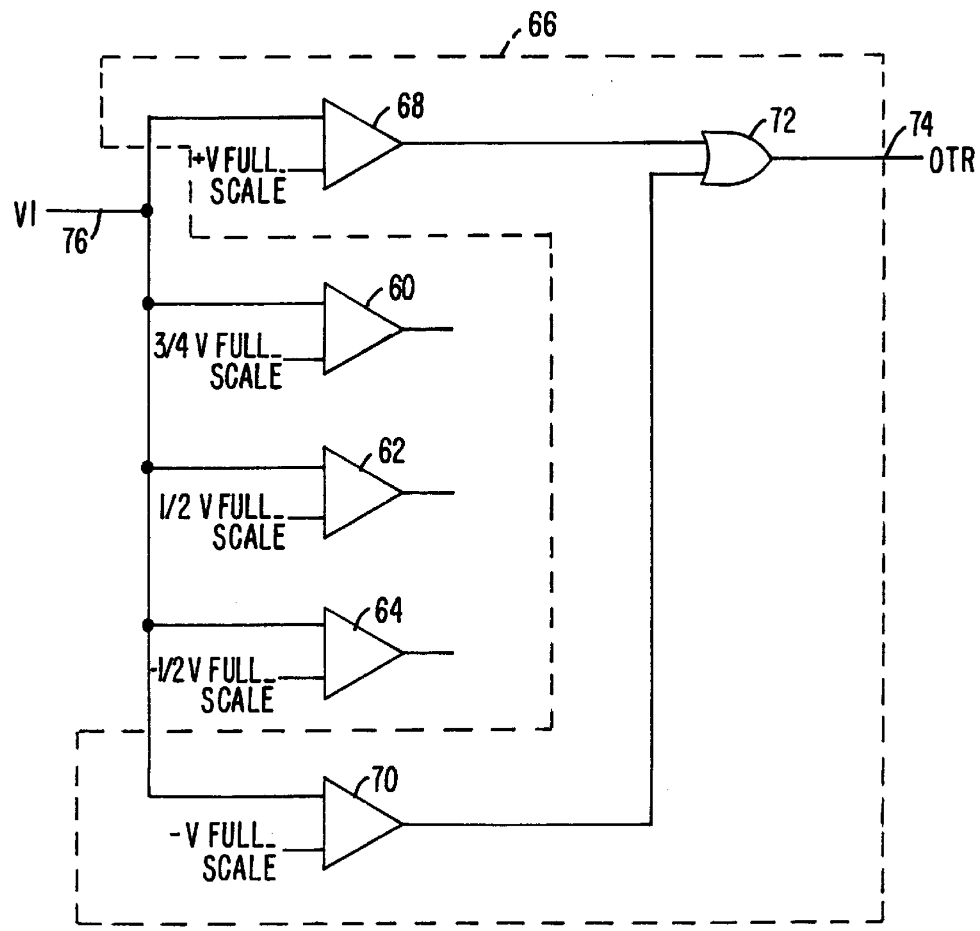
FIG. 4 is a diagram of a stage of a pipeline comparator incorporating the present invention.

However, in the last stage, a flash architecture of three comparators is used as illustrated as illustrated in FIG. 4 with the three central comparators 60, 62 and 64 providing a two bit value which does not need to be corrected by a subsequent stage (and cannot, since there is no subsequent stage).

The present invention adds the circuitry identified by dotted line 66 in FIG. 4 to this last stage. Circuitry 66 includes a positive full scale comparator 68, a negative full scale comparator 70 and an OR gate 72 to produce the OTR signal on a line 74. As can be seen, the input signal on line 76 is provided not only to comparators 60, 62 and 64, but also to out-of-range detect comparators 68 and 70. Comparator 68 receives the positive full scale voltage on its negative input, while comparator 70 receives the negative full scale voltage on its positive input.

To the extent these comparators have an offset voltage, if this offset error is input referred through the gain of the cascade of amplifiers in the preceding stages, the result is an input referred offset of $Vos/2^{N-2}$. This results in the accuracy requirements of these over range comparators 60 and 70 being greatly reduced compared to the accuracy required for the similar comparators shown in FIG. 1. Especially for a large value of N, the present invention greatly reduces the complexity of the OTR comparators and their needed accuracy.

Although the comparators for generating the OTR signal are shown in the last stage in FIG. 4, in an alternate embodiment, these comparators could be added to any intermediate stage of the pipeline. Although optimum results are believed to be obtained by using the last stage, some lessening of the requirement for accuracy in the comparators is achieved for each stage down the cascade these comparators are moved (although fault detection capability is lost).

The placement of these comparators at the end of the pipeline of the ADC has an additional benefit. If the offsets of the interstage comparators does exceed the correction value of ±V full-scale/4, then the residue will saturate each subsequent stage. This will be detected by the OTR comparators and can be used to detect a fault condition.

Another benefit is that the OTR signal can be easily computed with the use of just one digital gate, OR gate 72. In contrast, other approaches such as 2-step flash or 2bit/stage pipelines, the correction logic must be extended to include additional carry and borrow signals.

As would be understood by those skilled in the art, the present invention may be embodied in other specific forms without departing from the spirit or essential characteristics thereof. Accordingly, the foregoing description is intended to be illustrative, but not limiting, of the scope of the invention which is set forth in the following claims.

What is claimed is:

1. An analog to digital converter comprising:

a plurality of stages, each stage producing a portion of the digital result, with the most significant bit being produced by the first stage;

a high-end comparator configured to accept a full scale signal applied to said first stage and coupled to a single chosen stage of said converter beyond said first stage;

a low-end comparator configured to accept a full scale signal applied to said first stage and coupled to said chosen stage of said converter; and an out of range logic block having inputs coupled to outputs of said high-end and low-end comparators.

2. The analog to digital converter of claim 1 wherein said chosen stage is a last stage.

3. The analog to digital converter of claim 2 wherein said last stage is constructed using a flash architecture.

4. The analog to digital converter of claim 3 wherein said stages other than said last stage are constructed with logic producing a residue signal.

5. The analog to digital converter of claim 1 wherein said high end is a full scale positive voltage, and the low end is a full scale negative voltage of said analog to digital converter.

6. An analog to digital converter comprising:

a plurality of stages, each stage producing a portion of the digital result, with the most significant bit being produced by the first stage;

a positive comparator configured to accept a full scale signal applied to said first stage and coupled to a last stage of said converter beyond said first stage;

a negative comparator configured to accept a full scale signal applied to said first stage and coupled to said last stage of said converter; and an out-of-range logic block having inputs coupled to outputs of said positive and negative comparators.

* * * * *